United States Patent [19]

Imaizumi et al.

[11] 4,423,433
[45] Dec. 27, 1983

[54] HIGH-BREAKDOWN-VOLTAGE RESISTANCE ELEMENT FOR INTEGRATED CIRCUIT WITH A PLURALITY OF MULTILAYER, OVERLAPPING ELECTRODES

[75] Inventors: Ichiro Imaizumi, Tokyo; Shikayuki Ochi, Akishima; Masatoshi Kimura, Hachioji; Masayoshi Yoshimura, Hamuramachi; Takashi Yamaguchi, Tachikawa; Toyomasa Koda, Kokubunji, all of Japan

[73] Assignee: Hitachi, Ltd., Tokyo, Japan

[21] Appl. No.: 156,015

[22] Filed: Jun. 3, 1980

[30] Foreign Application Priority Data

Jun. 4, 1979 [JP] Japan ................................. 54-68972

[51] Int. Cl.³ .......................................... H01L 27/02
[52] U.S. Cl. .................................... 357/51; 357/53; 357/54; 357/23
[58] Field of Search .................... 357/51, 53, 54, 23 D

[56] References Cited

U.S. PATENT DOCUMENTS

| | | | |
|---|---|---|---|
| 3,518,494 | 6/1970 | James | 357/53 |
| 3,573,571 | 4/1971 | Brown et al. | 357/53 |
| 3,593,068 | 7/1971 | Rosier | 357/53 |
| 3,683,491 | 8/1972 | Nelson et al. | 357/53 |
| 4,040,083 | 8/1977 | Saiki et al. | 357/54 |
| 4,172,260 | 10/1979 | Okabe et al. | 357/51 |
| 4,246,502 | 1/1981 | Kubinec | 357/51 |
| 4,263,518 | 4/1981 | Ballatore et al. | 357/51 |
| 4,309,626 | 1/1982 | Kudo | 357/51 |

FOREIGN PATENT DOCUMENTS 52-44580 4/1977 Japan ................................. 357/53

OTHER PUBLICATIONS

Texas Instruments New Product Review, Wescon, 1964, p. 11.

*Primary Examiner*—Joseph E. Clawson, Jr.
*Attorney, Agent, or Firm*—Antonelli, Terry & Wands

[57] ABSTRACT

A high-breakdown-voltage resistance element comprises a semiconductor body, an impurity layer disposed in a surface region of the semiconductor body to provide a resistor body, a first electrode connected to one end of the resistor body through a contact hole in a first insulating film formed on the surface of the semiconductor body, and a second electrode connected to the other end of the resistor body through another contact hole in the insulating film. A second insulating film is formed on the first and second electrodes, and a third electrode is connected to the first electrode through a contact hole in the second insulating film, so that the entire surface of the resistor body and adjacent areas are covered with the first, second and third electrodes.

11 Claims, 8 Drawing Figures

HIGH-BREAKDOWN-VOLTAGE RESISTANCE ELEMENT FOR INTEGRATED CIRCUIT WITH A PLURALITY OF MULTILAYER, OVERLAPPING ELECTRODES

BACKGROUND OF THE INVENTION

1. Field of the Invention

This invention relates to a high-breakdown-voltage resistance element for use in a high-power, i.e., high-breakdown-voltage semiconductor integrated circuit.

More particularly, this invention relates to a resistance element having an impurity region disposed in a surface region of a semiconductor body, and having a high-breakdown-voltage characteristic.

2. Description of the Prior Art

A diffused resistance is generally used as a resistance element in a semiconductor integrated circuit (an IC or an LSI). FIGS. 1A and 1B are a schematic plan view and a schematic sectional view respectively to show one form of such a diffused resistance in a semiconductor integrated circuit. Referring to FIGS. 1A and 1B, a silicon epitaxial-grown layer (a collector epitaxial layer) 12 of N-type conductivity is formed on a silicon substrate 11 of P-type conductivity. Diffusion layers 13 and 13' are formed in the silicon epitaxial-grown layer 12 of N-type conductivity, each of which is a base diffusion layer of P-type conductivity or an emitter diffusion layer of N+-type conductivity and provides a resistor body. Numeral 14 designates an isolation region of P+-type conductivity, and numeral 15 designates an insulating film of an electrical insulator such as SiO$_2$. Numerals 16, 16' designate electrodes provided by depositing a metal such as aluminum, and numerals 17, 17' designate contact holes.

FIGS. 1A and 1B illustrate, by way of example, that two resistance elements 10 and 10' are provided in a single isolated region 12.

When such a diffusion layer 13 (13') of P-type conductivity or N+-type conductivity is formed in the semiconductor layer 12 of N-type conductivity to function as a resistor body as shown in FIGS. 1A and 1B, a parasitic MOS transistor tends to be produced by the mobile carriers at the oxide-resin-package interface or the interface between the insulating film 15 and the semiconductor layer 12. In such a case, a conductive channel will be formed to extend between the resistor bodies 13, 13' or between the resistor body 13 and the diffusion layer 14 provided for isolation, as shown by the dotted lines in FIG. 1A, resulting in undesirable variation of the resistor value or in undesirable formation of a parasitic resistor.

The tendency of the production of such a parasitic MOS transistor appears markedly especially when the diffused resistance is supplied with a high voltage thereacross. Therefore, in an application in which a high voltage is applied across the diffused resistance, it has been a prior art practice that the electrodes 16 and 16' are extended to provide field plates 160 which cover substantial portions of the surface of the diffusion layers 13 and 13' of P-type or N+-type conductivity.

However, a single layer electrode cannot be used to cover all the surface areas of the resistor bodies 13 and 13' because of the fact that a high-potential electrode and a low-potential electrode are required for each resistance element. Thus, resistor portions 18 and 18' not covered with the electrode layer remain as seen in FIGS. 1A and 1B, and these portions 18 and 18' will still act as a source and a drain of a parasitic MOS transistor tending to be produced by the mobile carriers at the oxide-resin-package interface.

The action of such a parasitic MOS transistor results in undesirable variation of the resistor value or in the undesirable formation of a primarily unnecessary parasitic resistor as pointed out hereinbefore. Thus, the problem of obtaining a predictable normal operation required for a resistance element in an integrated circuit has previously been unsolved, especially in high voltage.

SUMMARY OF THE INVENTION

Accordingly, an object of this invention is to provide an improved resistance element for use in an integrated circuit which can suppress the parasitic MOS transistor action of the prior art high-breakdown-voltage resistance element using field plates.

In order to accomplish the above object, the resistance element of this invention comprises an impurity layer disposed in a surface region of a semiconductor body, first layer electrodes covering the main portion of the impurity region through an insulating layer, and a second layer electrode(s) covering the non-metalized portion of the impurity layer between the first layer electrodes through an insulating layer, whereby a resistor body provided by the impurity layer is covered with the combination of the first layer electrodes and the second layer electrode(s).

DESCRIPTION OF THE PREFERRED EMBODIMENTS

Hereunder, this invention will be described in detail with reference to FIGS. 2A to 3B showing preferred embodiments thereof.

Figure 1A:
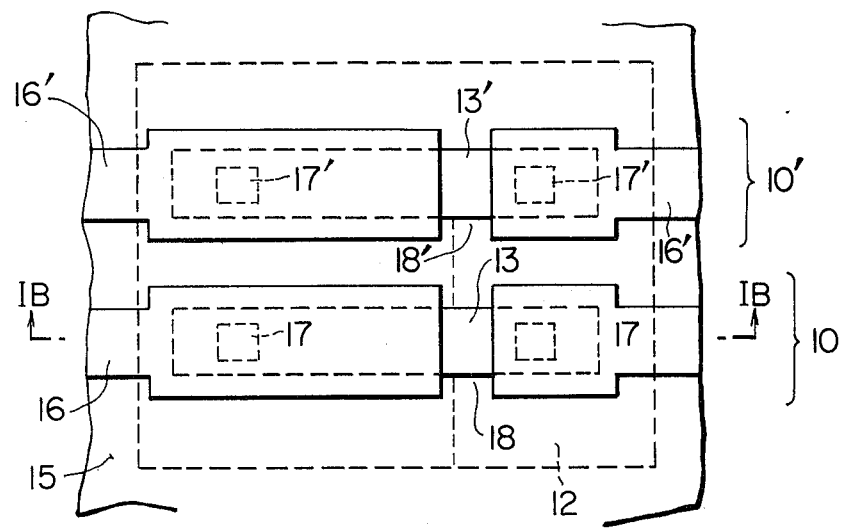
FIG. 1A is a schematic plan view to show a prior art resistance element having field plates.
Figure 1B:
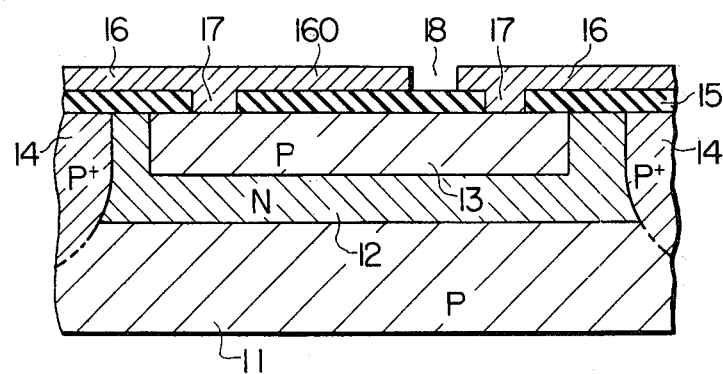
FIG. 1B is a schematic sectional view taken along the line IB—IB in FIG. 1A.
Figure 2A:
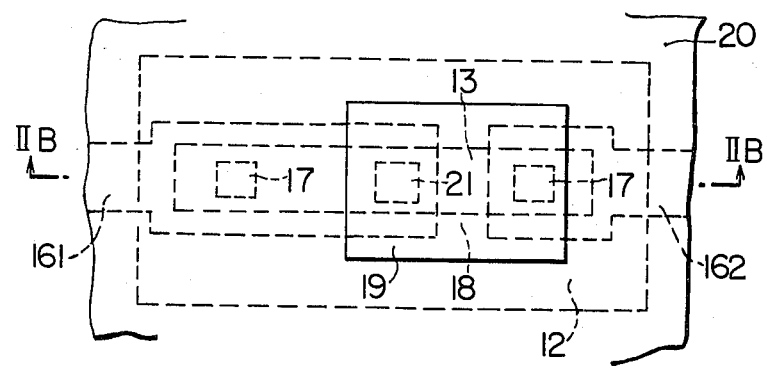
FIG. 2A is a schematic plan view to show an embodiment of the high-breakdown-voltage resistance element according to the present invention.
Figure 2B:
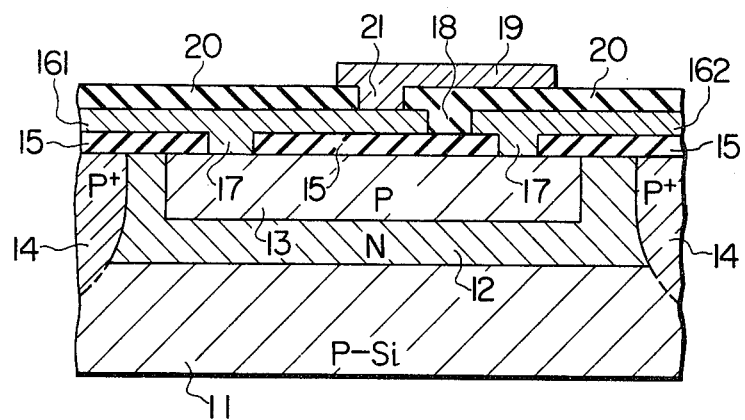
FIG. 2B is a schematic sectional view taken along the line IIB—IIB in FIG. 2A.

FIGS. 2A and 2B show an embodiment of the resistance element, according to the present invention and are a schematic plan view and a schematic sectional view of the resistance element respectively. In FIGS. 2A and 2B, parts designated by the reference numerals 11 to 18 are the same as or equivalent to those appearing in FIGS. 1A and 1B, and the high-potential electrode and low-potential electrode are designated by the reference numerals 161 and 162 respectively. Numeral 19 designates a second layer electrode whose potential level is equal to that of the high-potential electrode 161. Numeral 20 designates an additional insulating film of, for example, SiO$_2$ similar to the insulating film 15, and numeral 21 designates a contact hole which provides electrical contact between the electrodes 161 and 19. In the embodiment shown in FIGS. 2A and 2B, the high-potential electrode 161 is extended toward the low-potential electrode 162 so that it terminates at a position very close to the corresponding end of the low-potential electrode 162, and the second layer electrode 19 whose potential level is equal to that of the high-potential electrode 161 is also extended in the same direction to overlie the corresponding end portion of the low-potential electrode 162 so that it completely covers the non-metalized portion 18 of the resistance element. According to such an arrangement, no parasitic MOS transistor is produced because the potential of the electrode 161 is always higher than that of the impurity layer 13. More precisely, the entire surface area of the resistor body 13 provided by the P-type or N$^+$-type impurity layer and areas adjacent to the above surface area are covered over with the first layer electrodes 161, 162 and second layer electrode 19 of double layer arrangement, so that formation of an undesirable parasitic MOS transistor can be completely obviated. Practically, it is preferable that the electrodes 161, 162 and 19 are desposited to cover the area within the range of at least 10 $\mu$m from the edges of the resistor body 13.

FIGS. 2A and 2B illustrate, by way of example, that only one resistor is provided in the isolated region 12. It is apparent, however, that a plurality of such resistors may be provided, and each of these resistors may be covered at its entire surface area and adjacent areas with the electrodes of double layer arrangement.

An increase in the potential difference across the resistance element causes a corresponding increase in the potential difference between the high-potential electrode 161 and the impurity layer 13 of P-type conductivity.

The breakdown voltage between the impurity layer 13 of P-type conductivity and the semiconductor layer 12 of N-type conductivity is limited by the latter potential difference. When, for example, the insulating film 15 has a thickness of 1 $\mu$m, the impurity layer 13 has a depth of 2.7 $\mu$m and a sheet resistance of 200 $\Omega$/sq., and a potential difference of 100 V is applied across the resistance element, the breakdown voltage between the impurity layer 13 of P-type conductivity and the semiconductor layer 12 of N-type conductivity is limited to a value of about 100 V.

This limitation can be overcome, and a resistance element having a higher breakdown voltage and operable without the parasitic MOS transistor action can be obtained when an intermediate electrode lying intermediate between the first layer electrodes is connected to an intermediate portion of the resistor body 13 so as to suitably limit the potential of the first layer electrodes.

Figure 3A:
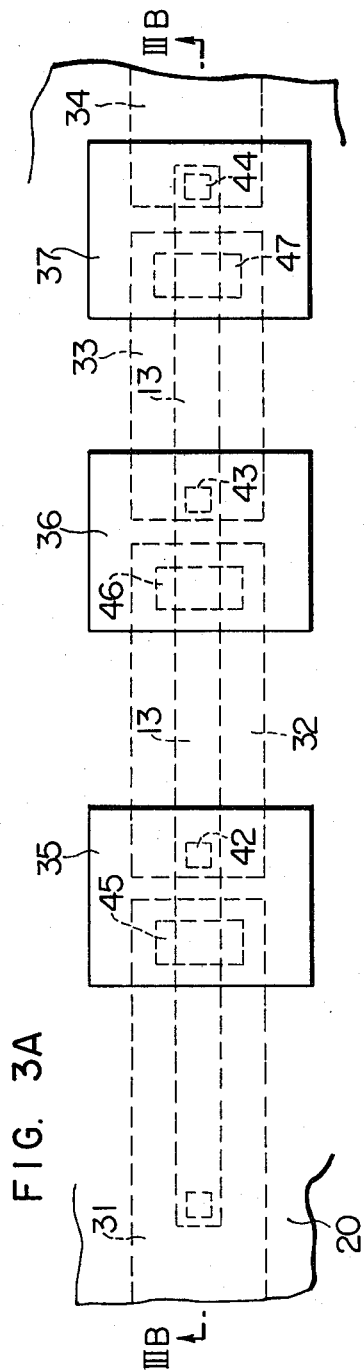
FIG. 3A is a schematic plan view to show another embodiment of the high-breakdown-voltage resistance element according to the present invention.
Figure 3B:
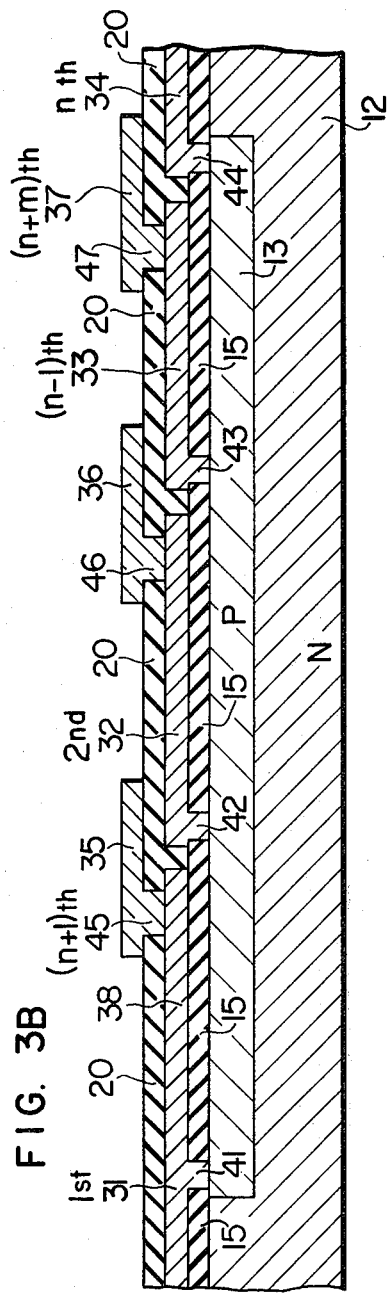
FIG. 3B is a schematic sectional view taken along the line IIIB—IIIB in FIG. 3A.

FIGS. 3A and 3B show an embodiment of the resistance element of the type provided with such an intermediate electrode and are a schematic plan view and a schematic sectional view respectively of the resistance element.

Referring to FIGS. 3A and 3B, a resistor body 13 of P-type conductivity is formed in a surface region of a semiconductor body 12 of N-type conductivity and is connected at its opposite ends to terminal electrodes 31 and 34 of, for example, aluminum respectively. Intermediate electrodes 32 and 33 of, for example, aluminum are connected respectively to portions of the resistor body 13 intermediate between the opposite ends. The electrodes 31, 32 and 33 are extended toward the electrodes 32, 33 and 34 so that they terminate at positions close to the corresponding ends of the electrodes 32, 33 and 34 respectively. Second layer electrodes 35, 36 and 37 are provided to cover the non-metalized resistor portions respectively. In FIGS. 3A and 3B, numeral 15 designates an insulating film of, for example, SiO$_2$, and numeral 20 designates an insulating film of, for example, PII (polyimide iso-indro quinazoline dione) or SiO$_2$. Numerals 41, 42, 43 and 44 designate contact holes provided for electrical contact of the first layer electrodes 31, 32, 33 and 34 with the resistor body 13 respectively, and numerals 45, 46 and 47 designate contact holes provided for electrical contact of the second layer electrodes 35, 36 and 37 with the first layer electrodes 31, 32 and 33 respectively.

A sample of the resistance element shown in FIGS. 3A and 3B was made, in which the silicon epitaxial layer 12 of N-type conductivity had an impurity concentration of 2.5 × 10$^{14}$ cm$^{-3}$ and a thickness of 35 $\mu$m, the resistor body 13 of P-type conductivity had a width of 10 $\mu$m, a length of 50 $\mu$m, a depth of 2.7 $\mu$m and a sheet resistance of 200 $\Omega$/sq., and the two intermediate electrodes 32 and 33 were connected to two intermediate portions of the resistor body 13 through the contact holes 42 and 43 respectively. When the potential difference between the terminal electrodes 31 and 34 was 140 V, the breakdown voltage between the impurity layer 13 of P-type conductivity and the semiconductor layer 12 of N-type conductivity was also 140 V in this sample. Further, this resistance element was completely free from the undesirable parasitic MOS transistor action.

The intermediate electrodes 32 and 33 may usually be connected to the resistor body 13 at points 42 and 43, respectively, which lie at each voltage drop of 40 V through 50 V.

Figure 4A:
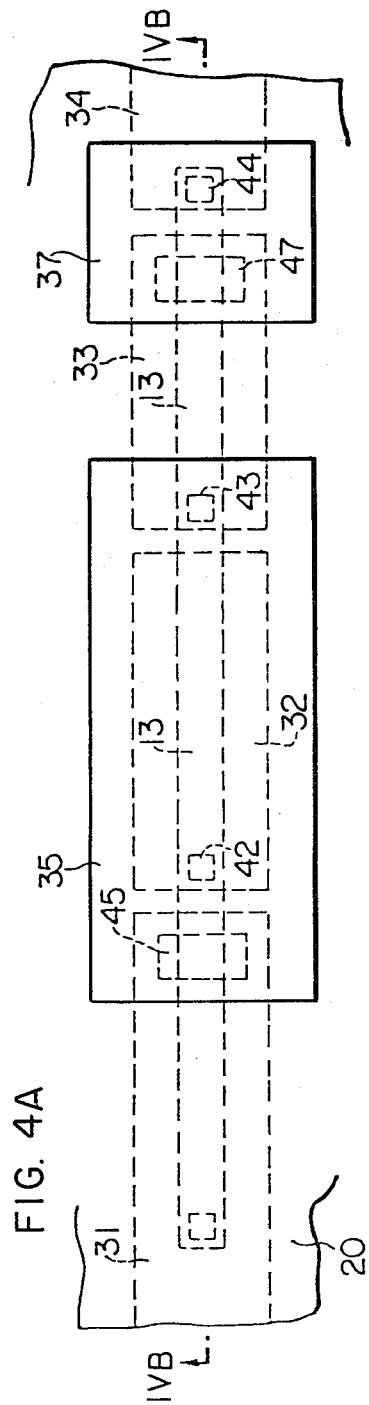
FIGS. 4A and 4B respectively show a schematic plan view and a schematic sectional view along line IVB—IVB of a modification of the embodiment shown in FIGS. 3A and 3B.
Figure 4B:
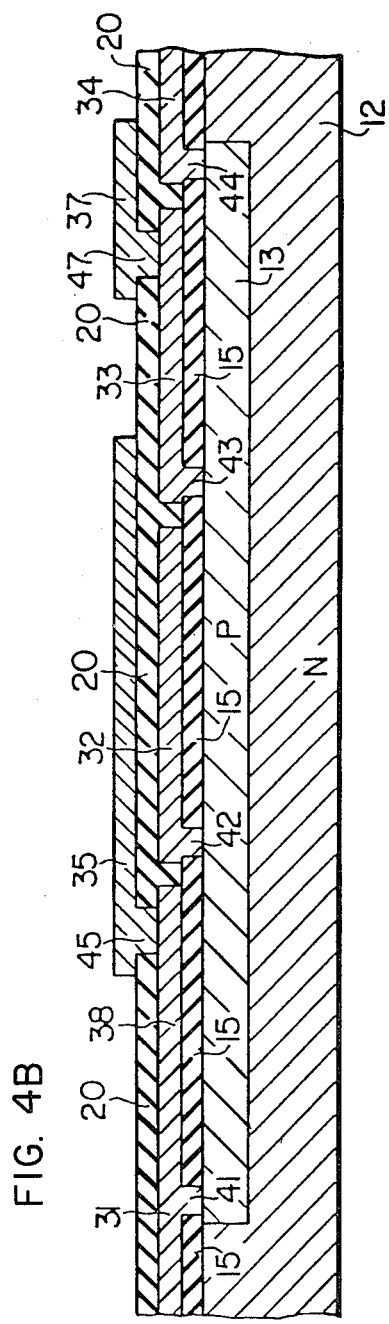

It is the basic idea of the present invention that the potential of each of the second layer electrodes be higher than that of the underlying portion of the resistor body and need not necessarily be equal to that of the associated first layer electrode connected directly thereto, unlike the arrangement shown in FIGS. 3A and 3B. Thus, the second layer electrodes may have any other suitable potential. For example, the second layer electrodes 36 and 37 may be connected to the first layer electrode 31. In this case, the second layer electrodes 35, 36 and 37 can be replaced by the single extended electrode which may be connected to the high-potential electrode 31. A modification of FIGS. 3A and 3B along these lines is shown in FIGS. 4A and 4B, by way of example.

The impurity layer 13 constituting the resistor body in the aforementioned embodiments of the present invention includes any one of a diffusion layer formed by thermal diffusion, an impurity layer formed by ion implantation, an impurity layer formed by epitaxial growth and other suitable impurity layers. It is to be noted further that the conductivity types of the layers 11 to 14 are in no way limited to those specified hereinbefore.

What is claimed is:

1. A high-breakdown-voltage resistance element comprising a semiconductor body, an impurity layer disposed in a surface region of said semiconductor body to provide a resistor body, and n first layer electrodes (n: a positive integer) connected to said resistor body through corresponding contact holes in a first insulating film formed on the surface of said semiconductor body, said n first layer electrodes being arranged in such a relation that the 1st electrode of said n first layer electrodes is connected to one end of said resistor body, the 2nd to (n−1)th electrodes of said n first layer electrodes are connected to intermediate portions of said resistor body, and the n-th electrode of said n first layer electrodes is connected to the other end of said resistor body, said n electrodes of said n first layer electrodes being separated from one another by predetermined spaces along said first insulating film so that said n electrodes do not contact one another and so that a plurality of regions of said resistor body are left uncovered by said n first layer electrodes, said resistance element further comprising a second insulating film formed on said 1st to n-th electrodes of said n first layer electrodes, and m second layer electrodes (m: a positive integer smaller than n) comprising (n+1)th electrodes deposited on said second insulating film and connected to selected ones respectively of said 1st to (n−1)th electrodes among said n first layer electrodes, said m second layer electrodes covering said plurality of regions of said resistor body which are uncovered by said n electrodes of said first layer electrodes so that said 1st to (n+m)th electrodes cover a surface region including the entire surface of said resistor body and areas of said semiconductor body adjacent thereto.

2. A high-breakdown-voltage resistance element as claimed in claim 1, wherein said second layer electrodes comprise (n+1)th to (2n−1)th electrodes totaling (n−1), said (n+1)th to (2n−1)th electrodes being connected to said 1st to (n−1)th electrodes respectively through corresponding contact holes in said second insulating film, and said 1st to (2n−1)th electrodes cover the surface region including the entire surface of said resistor body and areas adjacent thereto.

3. A high-breakdown-voltage resistance element as claimed in claim 2, wherein said 1st electrode covers a portion of the surface region including one end portion of said resistor body and an area adjacent thereto and extends toward and terminates close to said 2nd electrode to cover also a portion of the surface region of said resistor body and an area adjacent thereto, said 2nd to (n−1)th electrodes extend toward and terminate close to said 3rd to nth electrodes respectively to cover portions of the surface region including 2nd to (n−1)th regions of said resistor body and areas adjacent thereto, said n-th electrode covers a portion of the surface region including the other end portion of said resistor body and an area adjacent thereto, and said (n+1)th to (2n−1)th electrodes cover portions of the surface region including (n+1)th to (2n−1)th regions of said resistor body which are not metalized and remain between said 1st and 2nd electrodes, . . . , and between said (n−1)th and n-th electrodes respectively.

4. A high-breakdown-voltage resistance element as claimed in claim 1 or 2, wherein said 1st electrode provides the high-potential terminal of said resistor body, and said n-th electrode provides the low-potential terminal of said resistor body.

5. A high-breakdown-voltage resistance element as claimed in claim 1, wherein said second insulating film extends through said predetermined spaces between said n first layer electrodes to contact said first insulating film, and wherein said m second layer electrodes extend along said second insulating film to cover said predetermined spaces.

6. A high-breakdown-voltage resistance element as claimed in claim 1, wherein said second layer electrodes comprise (n+1)th to (2n−1)th electrodes totaling (n−1) where m=n=1, said (n+1)th to (2n−1)th electrodes being connected to said 1st to (n−1)th electrodes respectively through corresponding contact holes in said second insulating film, and said 1st to (2n−1)th electrodes cover the surface region including the entire surface of said resistor body and areas adjacent thereto.

7. A high-breakdown-voltage resistance element as claimed in claim 2, wherein said 1st electrode covers a portion of the surface region including one end portion of said resistor body and an area adjacent thereto and extends toward and terminates close to said 2nd electrode to cover also a portion of the surface region of said resistor body and an area adjacent thereto, said 2nd to (n−1)th electrodes extend toward and terminate close to said 3rd to n-th electrodes respectively to cover portions of the surface region including 2nd to (n−1)th regions of said resistor body and areas adjacent thereto, said n-th electrode covers a portion of the surface region including the other end portion of said resistor body and an area adjacent thereto, and said (n+1)th to (2n−1)th electrodes cover portions of the surface region including (n+1)th to (2n−1)th regions of said resistor body which are not metalized and remain between said 1st and 2nd electrodes, . . . , and between said (n−1)th and n-th electrodes respectively.

8. A high-breakdown-voltage resistance element comprising a semiconductor body, an impurity layer disposed in a surface region of said semiconductor body and isolated by a PN-junction from an adjacent semiconductor region, said impurity layer having a higher impurity concentration than that of the adjacent semiconductor region and a substantially uniform thickness to provide a resistor body, and n first layer electrodes (n: a positive integer) connected to said resistor body through corresponding contact holes in a first insulating film formed on the surface of said semiconductor body, said n first layer electrodes being arranged in such a relation that the 1st electrode of said n first layer electrodes is connected to one end of said resistor body, the 2nd to (n−1)th electrodes of said n first layer electrodes are connected to intermediate portions of said resistor body along its length, and the n-th electrode of said n first layer electrodes is connected to the other end of said resistor body, said n first layer electrodes being on a common plane with one another above a surface of said resistor body with said n electrodes of said n first layer electrodes being separated from one another so that said n electrodes do not contact one another and so that a plurality of regions of said resistor body are left uncovered by said n first layer electrodes, said resistance element comprising a second insulating film formed on said 1st to n-th electrodes of said n first layer electrodes, and m second layer electrodes (m: a positive integer smaller than n) comprising (n+1)th to (n+m)th electrodes deposited on said second insulating film and connected to selected ones respectively of said 1st to (n−1)th electrodes among said n first layer electrodes, said m second layer electrodes covering said plurality of regions of said resistor body which are uncovered by said n electrodes of said first layer electrodes so that said 1st to (n+m)th electrodes covering a surface region including the entire surface of said resistor body and areas adjacent thereto.

9. A high-breakdown-voltage resistance element as claimed in claim 1 or 8, wherein the electrode among said second layer electrodes lying on the p-th electrode in the first layer electrodes (p: a positive integer, $1 \leq p \leq n$) is connected to a selected one of the 1st to (p−1)th electrodes among said first layer electrodes.

10. A high-breakdown-voltage resistance element as claimed in claim 8 or 6, wherein said 1st electrode provides a high-potential terminal of said resistor body, and said n-th electrode provides a low-potential terminal of said resistor body.

11. A high-breakdown-voltage resistance element as claimed in claim 8, wherein said second insulating film extends through said predetermined spaces between said n first layer electrodes to contact said first insulating film, and wherein said m second layer electrodes extend along said second insulating film to cover said predetermined spaces.

* * * * *